United States Patent
West et al.

(10) Patent No.: US 6,974,229 B2
(45) Date of Patent: Dec. 13, 2005

(54) DEVICES FOR CREATING BRIGHTNESS PROFILES

(75) Inventors: Robert S. West, Morgan Hill, CA (US); Yourii Martynov, Eindhoven (NL); Huub Konijn, Huizen (NL); Nicola Pfeffer, Eindhoven (NL); Simon J. M. Kuppens, Geldrop (NL)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/442,346

(22) Filed: May 21, 2003

(65) Prior Publication Data

US 2004/0233665 A1    Nov. 25, 2004

(51) Int. Cl.⁷ .................................. F21S 2/00
(52) U.S. Cl. .............. 362/227; 362/555; 362/560; 362/561; 362/511; 362/231; 362/240; 362/241; 362/243; 362/296; 362/800; 362/330; 362/343
(58) Field of Search ............... 362/227, 31, 555, 362/558, 560, 561, 511, 545, 228, 231, 240, 362/241, 243, 296, 341, 800, 330, 343

(56) References Cited

U.S. PATENT DOCUMENTS

| | | | |
|---|---|---|---|
| 5,550,657 A | * | 8/1996 | Tanaka et al. ............... 349/62 |
| 5,816,677 A | * | 10/1998 | Kurematsu et al. ........... 362/31 |
| 6,007,209 A | | 12/1999 | Pelka |
| 6,079,844 A | | 6/2000 | Whitehead et al. |
| 6,439,731 B1 | | 8/2002 | Johnson et al. |
| 6,582,103 B1 | | 6/2003 | Popovich et al. ........... 362/307 |
| 2001/0046131 A1 | * | 11/2001 | Hoelen et al. .............. 362/231 |
| 2004/0061810 A1 | * | 4/2004 | Lowery et al. ............... 349/62 |

FOREIGN PATENT DOCUMENTS

| | | |
|---|---|---|
| EP | 1 255 306 A2 | 11/2002 |
| GB | 2 267 378 A | 12/1993 |
| WO | WO 01/07828 A1 | 2/2001 |

OTHER PUBLICATIONS

Partial European Search Report, 5 pages.
Complete European Search Report, 6 pages.

* cited by examiner

*Primary Examiner*—Sandra O'Shea
*Assistant Examiner*—Sharon Payne
(74) *Attorney, Agent, or Firm*—Rachel V. Leiterman; Patent Law Group LLP (57) ABSTRACT

A mixing chamber includes a first surface and a second surface opposite the first surface. At least two light emitting diodes are disposed along the first surface. At least a portion of the first surface is reflective, and the second surface includes a reflective region and a plurality of openings formed in the reflective region. In some embodiments, the first surface and the second surface are separated by at least one side surface. Light emitted from the light emitting diodes is reflected off the first surface, reflective region of the second surface, and side surfaces of the mixing chamber until it is emitted from the openings of the second surface.

18 Claims, 7 Drawing Sheets

DEVICES FOR CREATING BRIGHTNESS PROFILES

BACKGROUND

1. Field of Invention

This invention relates to techniques for creating predetermined brightness profiles in applications such as backlights for liquid crystal displays and illumination.

2. Description of Related Art

Liquid crystal displays (LCDs) are commonly used in battery operated equipment, such as cell phones, personal digital assistants, and laptop computers, and are becoming popular for desktop and television applications, where they replace bulky CRTs. One embodiment of the present invention deals with a color, transmissive LCD that requires backlighting, where the backlighting may contain red, green, and blue components.

Figure 1:
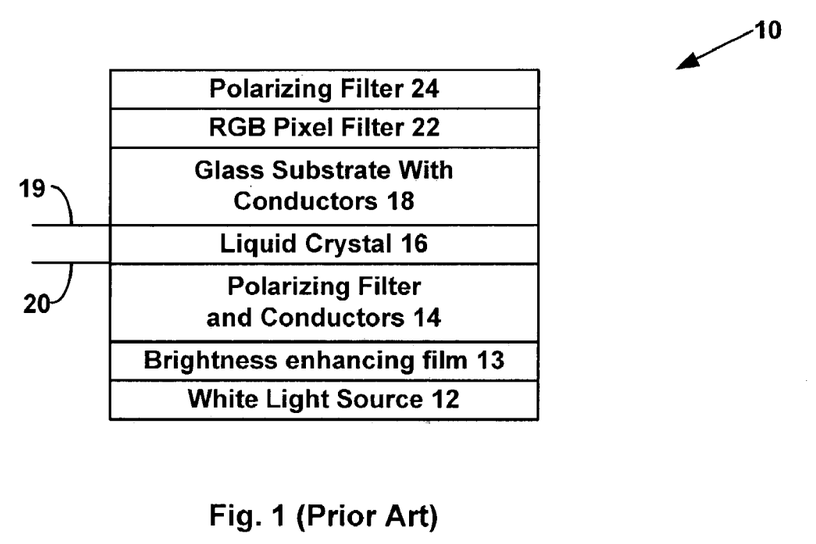
FIG. 1 is a cross-section of a prior art, color, transmissive LCD using a white light source.
Figure 2:
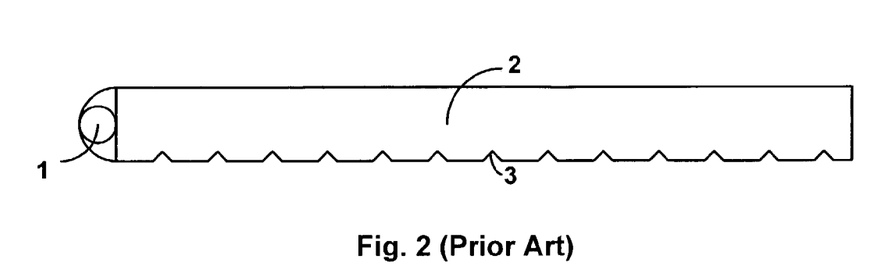
FIG. 2 is a prior art light guide optically coupled to a white light source.

FIG. 1 is a cross-sectional view of a small portion of a prior art, color, transmissive LCD. There are other types of color, transmissive LCD structures. An LCD 10 includes a white light source 12 to provide backlighting for the upper LCD layers. A common source for white light is a fluorescent bulb. Another white light source is a combination of red, green, and blue light emitting diodes (LEDs) whose combined light forms white light. Other white light sources are known. The white light source must provide homogenous light to the back surface of the display. A popular technique for providing such a homogenous white light is illustrated in FIG. 2. White light source 1 is optically coupled to a light guide, such as by optically coupling light source 1 to one or more edges of a sheet of clear plastic 2. The sheet typically has deformities 3 that bend the light approximately normal to the top surface of the sheet so that light is emitted from the top surface. Examples of such deformities include ridges in the bottom surface, reflective particles embedded in the plastic sheet, or a roughening of the bottom surface of the sheet. The deformities cause a quasi-uniform plane of light to be emitted out the front surface of the light guide. A reflector may be placed behind the back surface of the light guide to improve brightness and uniformity.

A brightness enhancing film 13 may be positioned over light source 12. A polarizing filter 14 linearly polarizes the white light. In the embodiment shown in FIG. 1, the polarizing filter 14 is formed in a glass substrate having transparent conductors. Above polarizing filter 14 is a liquid crystal layer 16, and above liquid crystal layer 16 is a glass substrate 18 having transparent conductors. Selected conductors in the glass substrate are energized by display control signals coupled to electrodes 19 and 20. The absence of an electrical field across a pixel area of liquid crystal layer 16 causes light passing through that pixel area to have its polarization rotated orthogonal to the incoming polarization. An electrical field across a pixel area of liquid crystal layer 16 causes the liquid crystals to align and not affect the polarity of the light. Selectively energizing the conductors controls the localized electric fields across the liquid crystal layer 16. Both normally open (white) and normally closed (black) shutters are used in different displays. Instead of a passive conductor array, a transparent thin film transistor (TFT) array may be used, having one transistor for each pixel. TFT arrays are extremely well known.

The light output from glass substrate 18 is then filtered by an RGB pixel filter 22. RGB pixel filter 22 may be comprised of a red filter layer, a green filter layer, and a blue filter layer. The layers may be deposited as thin films. As an example, the red filter contains an array of red light filter areas coinciding with the red pixel areas of the display. The remaining portions of the red filter are clear to allow other light to pass. Accordingly, the RGB pixel filter 22 provides a filter for each R, G, and B pixel in the display.

A polarizing filter 24 only passes polarized light orthogonal to the light output from polarizing filter 14. Therefore, polarizing filter 24 only passes light that has been polarized by a non-energized pixel area in liquid crystal layer 16 and absorbs all light that passes through the energized portions of liquid crystal layer 16. The magnitudes of the electric fields across liquid crystal layer 16 control the brightness of the individual R, G, and B components to create any color. In this manner, any color image may be presented to the viewer by selectively energizing the various conductors.

The desired brightness profile in the LCD is achieved by plastic light guide 2. Plastic light guides such as light guide 2 of FIG. 2 add significant weight to LCD 10. In addition, if light source 1 is red, green, and blue LEDs, light guide 2 must be thick enough to sufficiently mix the light from the individual LEDs, such that the mixed light appears white. Such a thick light guide adds bulk to LCD 10. Further, devices using plastic light guides require many LEDs because of losses in the plastic and at interfaces between the plastic and surrounding materials.

SUMMARY

In accordance with an embodiment of the invention, a mixing chamber includes a first surface and a second surface opposite the first surface. At least two light emitting diodes are disposed along the first surface. At least a portion of the first surface is reflective, and the second surface includes a reflective region and a plurality of openings. In some embodiments, the first surface and the second surface are separated by at least one side surface. Light emitted from the light emitting diodes is reflected off the first surface, reflective region of the second surface, and side surfaces of the mixing chamber until it is emitted from the openings of the second surface. The reflective region and the openings in the second surface may be placed to achieve a predetermined brightness profile.

In accordance with another embodiment of the invention, a structure includes a light emitting diode, a lens overlying the light emitting diode, and a diverting optic overlying the lens. The diverting optic may include, for example, a specular or diffuse reflector, a bulk or film diffuser, and a transparent material. The diverting optic may be a disk, strip, or any other shape. The material, shape, and placement of the diverting optic may be selected to achieve a predetermined brightness profile.

DETAILED DESCRIPTION

Embodiments of the present invention can provide a predetermined brightness pattern in a large area without the use of large, plastic light guides. Applications of embodiments of the invention include illumination and backlighting.

Figure 3:
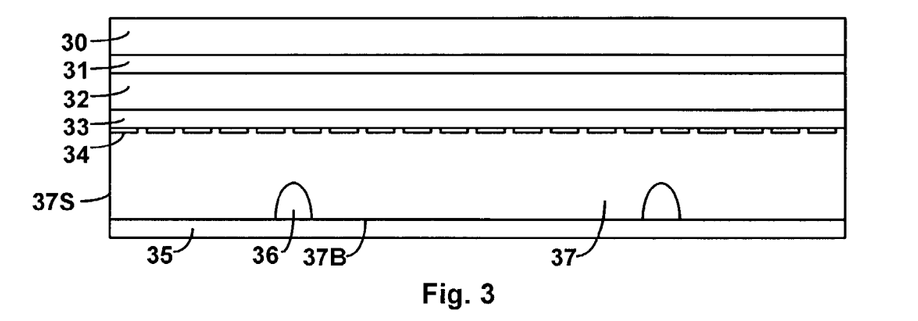
FIG. 3 is a cross-section of a portion of an LCD including a hollow mixing chamber, according to one embodiment of the present invention.
Figure 4:
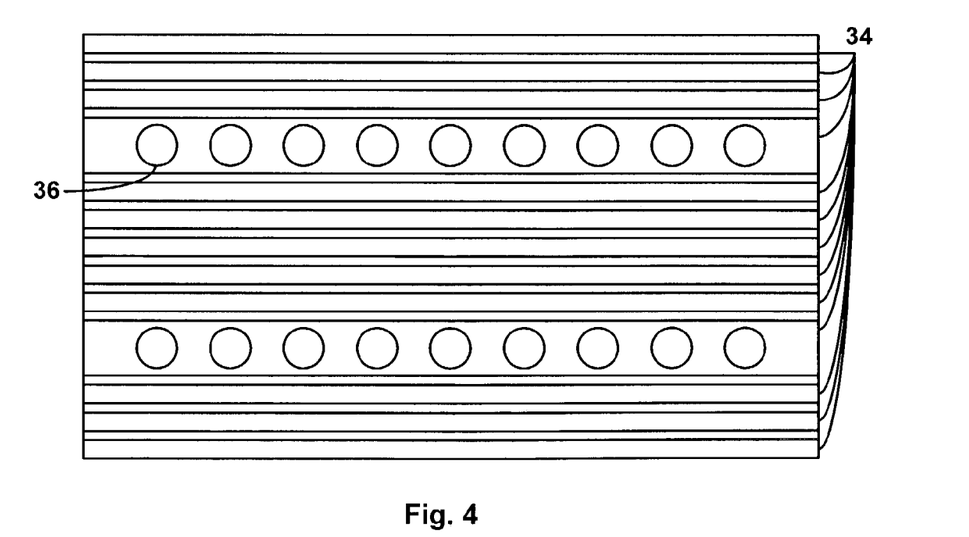
FIG. 4 is a top view of a portion of the mixing chamber illustrated in FIG. 3.

FIG. 3 illustrates a first embodiment of a device for providing a predetermined brightness profile. FIG. 3 illustrates a cross section of a hollow mixing chamber in a backlight, according to a first embodiment of the invention. FIG. 4 illustrates a top view of a portion of the mixing chamber illustrated in FIG. 3. As illustrated in FIG. 4, two rows of LEDs are disposed in a hollow mixing chamber 37. LEDs 36 may be mounted on a circuit board 35 such that the lenses of LEDs 36 protrude through the bottom 37B of mixing chamber 37. LEDs 36 may be, for example, red, green, and blue LEDs selected such that when the light emitted by LEDs 36 is mixed, it appears white. The number of LEDs may depend on the area of mixing chamber 37. In general, for a given brightness, larger areas require more LEDs. Mixing chamber 37 may be hollow and filled with air. Other materials, for example, other gases, may fill mixing chamber 37 instead of air. The material filling mixing chamber 37 is selected to be light weight, to be non-absorbing of light, and to have an index of refraction close to 1.0.

A material of high reflectance covers the sides 37S, bottom 37B, and parts of the top of mixing chamber 37. In some embodiments, the top and bottom of mixing chamber 37 are covered with a material of higher reflectance than the material covering the sides of mixing chamber 37. In some embodiments, the sides of mixing chamber 37 are not covered with a high reflectance material. The reflectance of high reflectance material 34 may depend on the design of mixing chamber 37. In some embodiments, high reflectance material 34 may have a reflectivity of at least 90% and preferably has a reflectivity greater than 98%. Examples of suitable high reflectance materials include enhanced specular reflector (ESR) films available from 3M; MIRO films available from ALANOD Ltd. Chippenham Drive, Kingston, Milton Keynes MK10 0AN, United Kingdom; spectraflect reflectance coating available from Labsphere PO Box 70, Shaker Street, North Sutton, N.H. 03260; and NBC coatings containing highly reflecting particles as halophosphates, calcium pyrophosphate strontium pyrophosphate and titanium dioxide, available from Philips.

The top of mixing chamber 37 has a transmissive region, for example openings in high reflectance material 34, and a reflective region, for example high reflectance material 34. The location, size, and shape of the openings in high reflectance material 34 may be selected based on the desired brightness profile, the type and placement of LEDs 36, and the shape of mixing chamber 37.

In order to provide a predetermined brightness profile, in general, a larger ratio of transmissive region to reflective surface is provided in the brighter regions of the profile and a smaller ratio of transmissive region to reflective surface is provided in the dimmer regions of the profile. For example, a brightness profile suitable for a backlight for a television may be parabolic, with the maximum brightness in the center and the minimum brightness on the sides of the backlight. The minimum brightness may be 50% of the maximum brightness. In such a device, there may be more transmissive region (i.e., space in the top of the mixing chamber that is not occupied by high reflectance material) near the center of the backlight than near the edges of the backlight, to emit more light at the center. In another example, a brightness profile suitable for a LCD computer monitor may be flatter than the television brightness profile, with a minimum brightness at the edge of the backlight 75–85% of the maximum brightness at the center of the backlight. Such a device would have more transmissive region at the center than the edge, as in the television example described above, but would have more transmissive region at the edge than the television example, in order to have a flatter brightness profile.

Figure 5:
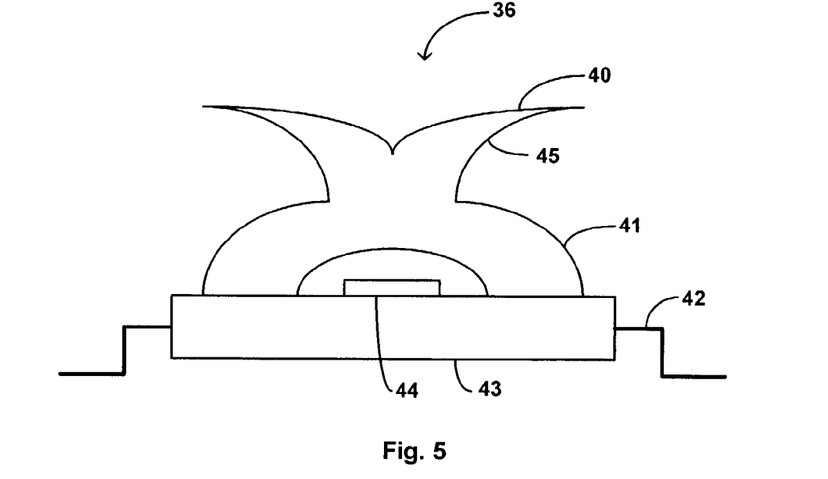
FIG. 5 illustrates an example of source used with the LCD of FIG. 3.
Figure 6:
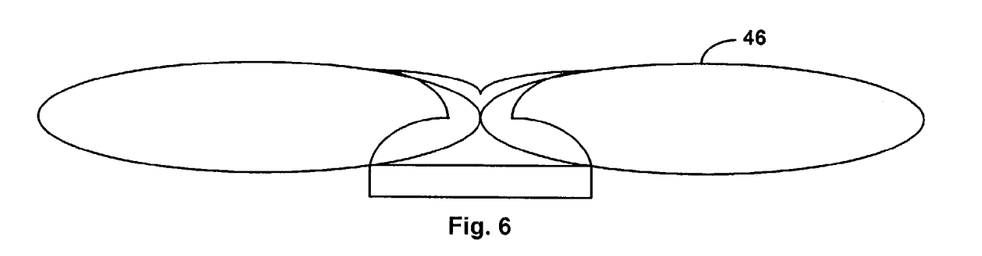
FIG. 6 illustrates a profile of light emitted by the source of FIG. 5.

In addition to the desired brightness profile, the type and placement of LEDs 36 will affect the location, size, and placement of the openings in high reflectance material 34. Generally, the area directly above LEDs 36 is reflective, in order to reflect any light emitted from the top of LEDs 36 back into the mixing chamber for mixing. In some embodiments, LEDs 36 are selected such that most of the light emitted by the LED is directed parallel to the top and bottom of mixing chamber 37, such that the light mixes before being emitted from mixing chamber 37. FIGS. 5 and 6 illustrate an example of a suitable LED 36. The lens over LED chip 44 is designed such that light emitted into top section is totally internally reflected on surface 40 such that it is incident on bottom surface 45 and refracted out of the device. Light emitted into section 41 is also refracted out of the device. The lens is designed to emit light in regions 46 illustrated in FIG. 6. The lens is attached to a frame 43. Leads 42 are electrically connected to LED chip 44 and are used to electrically and physically connect LED 36 to, for example, circuit board 35 shown in FIG. 3. Other examples of suitable side-emitting LEDs are described in more detail in application Ser. No. 09/849,042, filed May 4, 2001 and titled "Side Emitting Light Emitting Device;" application Ser. No. 09/849,084, filed May 4, 2001 and titled "Lens With Refractive And Reflective Surfaces;" and application Ser. No. 10/179,600, filed Jun. 24, 2002 and titled "Side Emitting LED and Lens," each of which are incorporated herein by reference. Side-emitting LEDs may be used to reduce the number of reflections necessary before light escapes mixing chamber 37. For a given efficiency, the fewer reflections are required, the less reflective high reflectance material 34 need be. In other embodiments, LEDs that emit a majority of light from the top rather than the side may be used, provided reflective material is provided directly over the LEDs to reflect the emitted light back into the mixing chamber to be mixed.

The shape of mixing chamber 37 may also influence the location, size, and shape of the openings in the reflective material 34 on the top of mixing chamber 37. The ratio of transmissive region to reflective surface on the top of mixing chamber 37 is a function of the amount of spreading of light required and the amount of color mixing required. As the amount of spreading and color mixing required increases, the ratio will generally decrease. For example, for a given brightness profile, a mixing chamber 37 with a large area relative to the number of LED sources 36 will require a lower ratio of transmissive region to reflective surface, than a mixing chamber with a smaller area relative to the number of LED sources 36, because the larger area mixing chamber requires more spreading. In addition, for a given brightness profile, a thin mixing chamber 37 will require a lower ratio than a thicker mixing chamber. In some embodiments, the shape of mixing chamber 37 can be selected to achieve a desired brightness profile or to further tune a brightness profile. For example, in a device with regions that are dimmer than the desired brightness profile, shortening the distance between the bottom surface 37B and the top surface of mixing chamber 37 in the dim regions may provide more brightness in the dim regions, without altering the size, shape, and location of the openings on the top of mixing chamber 37.

An example of a pattern of openings in the top of the high reflectance material in mixing chamber 37 is illustrated in FIG. 4. Strips of high reflectance material 34 are aligned parallel to two rows of LEDs 36 to form slits. In some embodiments, LEDs 36 may be placed in rings, modules, at random, or in configurations other than the rows illustrated in FIG. 4. In some embodiments, more or fewer rows of LEDs 36 are used. In some embodiments, the openings in high reflectance material 34 are holes or shapes other than the slits illustrated in FIG. 4. In the embodiment illustrated in FIG. 4, a strip the same width as LEDs 36 is located directly above LEDs 36. The slits formed in the reflective material need not all be the same size.

High reflectance material 34 may be a specular reflector or a diffuse reflector. A diffuse surface removes the directionality of reflected light and forces the light to be randomly oriented. Thus diffuse surfaces cause light to undergo more reflections as it spreads to the perimeter of mixing chamber 37, but also may improve color uniformity of light emitted from mixing chamber 37.

Light emitted from LEDs 36 is directly emitted through one of the openings in the high reflectance material on the top of mixing chamber 37 or reflects off one or more of the reflective surfaces of mixing chamber 37 until the light is emitted from one of the openings in high reflectance material 34. Each of the openings in high reflectance material 34 thus becomes a light source. As the light is reflected within mixing chamber 37, the light from different colored LEDs 36 mixes and spreads within mixing chamber 37, such that the light emitted from the openings in top 34 is color-mixed and of predetermined brightness. The light is emitted from the openings into diffuser 33, which may be, for example, a sheet of PMMA, polycarbonate, polystyrene, or glass. Diffuser 33 diffuses light towards LCD layers 30.

In some embodiments, diffuser 33 supports high reflectance material 34. For example, high reflectance material 34 may be tape that is mounted on diffuser 33, sputtered on diffuser 33, screen printed on diffuser 33, thermally evaporated on diffuser 33, or laminated on diffuser 33. High reflectance material 34 may be mounted on either the top or bottom surface of diffuser 33. In some embodiments, high reflectance material 34 is supported by a transparent material adjacent to diffuser 33. For example, high reflectance material 34 and diffuser 33 may be attached to opposite sides of a transparent acrylic sheet. Alternatively, high reflectance material 34 may be deposited on a transparent sheet, then diffuser 33 may be laminated over high reflectance material 34, such that light exiting mixing chamber 37 is incident on the transparent sheet prior to high reflectance material 34. In some embodiments, high reflectance material 34 is not supported by another material. For example, high reflectance material 34 may be a reflective metal sheet with openings formed in the sheet.

In some embodiments, high reflectance material 34 is highly reflective on both sides. Diffuser 33 may be a holographic, bulk or film diffuser, and is selected to be thin, to be highly transmissive, and to scatter light forward toward LCD layers 30. In embodiments using diffuse reflecting material as high reflectance material 34, diffuser 33 may be omitted. The light emitted from diffuser 33 is further mixed in mixing chamber 32, and is then incident on second diffuser 31. Mixing chamber 32 eliminates the appearance of the individual openings in high reflectance material 34 from the brightness profile and provides uniform light to diffuser 31. Above diffuser 31 one or more brightness enhancing films such a BEF and DBEF available from 3M may be incorporated before the remaining LCD layers, which maybe, for example, layers 14, 16, 18, 22, and 24 of FIG. 1.

In some embodiments, the size of the openings in high reflectance layer 34 must be many times smaller than the spacing between LCD layers 30 and diffuser 33, in order to provide sufficient mixing for color and brightness uniformity of the light. Thus, if the maximum permissible thickness for the display is known, the allowable distance between LCD layers 30 and diffuser 33 and therefore the maximum opening width required for mixing can be modeled or calculated. In some embodiments, the space between the top layer of mixing chamber 37 and diffuser adjacent to LCD 30 is greater than twice the pitch between the openings in high reflectance material 34. In one example of the embodiment illustrated in FIGS. 3 and 4, the opening strips in material 34 (as shown in FIG. 3) are 5 mm wide, the distance between the bottom of mixing chamber 37 and diffuser 31 is 25 mm, and the distance between diffuser 31 and diffuser 33 is 20 mm.

FIGS. 3 and 4 illustrate a hollow mixing chamber to be used as a backlight for a liquid crystal display. Such an embodiment will typically use red, green, and blue LEDs. In some embodiments, a hollow mixing chamber is used for illumination, for example, as an overhead light in a room. When the device of FIGS. 3 and 4 is used for illumination, LCD layers 30 are not included. The sources for illumination are selected such that the mixed light closely mimics sunlight by including as many wavelengths in the visible spectrum as possible. Generally, more wavelengths than the red, blue, and green wavelengths used for RGB displays will be used. In some embodiments, a device used for illumination may include one or more of the following wavelength LEDs: a device emitting light between about 420 and about 445 nm, a device emitting light between about 445 and about 470 nm, a device emitting light between about 470 and about 490 nm, a device emitting light between about 490 and about 560 nm, a device emitting light between about 560 and about 630 nm, a device emitting light between about 630 and about 645 nm, and a phosphor converted LED. Phosphor-converted LEDs may be used because, unlike unconverted LEDs which generally emit light in a narrow peak, phosphor converted LEDs often emit light in a broad peak, and thus supply more wavelengths of light than an unconverted LED.

The use of a mixing chamber as illustrated in FIGS. 3 and 4 offers several advantages. Since the mixing chamber is hollow, it is much lighter than a light guide formed from a sheet of plastic, as illustrated in FIG. 2. Much of the light emitted from the LEDs reflects off the bottom, sides, and/or top of the mixing chamber before being emitted from the mixing chamber from the openings in the reflective material on the top of the mixing chamber. The light cannot escape mixing chamber 37 without mixing with other light. In addition, improved mixing within the mixing chamber may eliminate the need for additional structures for mixing, which may reduce the thickness of a display incorporating a hollow mixing chamber. Further, eliminating the plastic light guide of FIG. 2 eliminates losses associated with interfaces between the plastic and adjoining surfaces and absorption in the plastic.

Though mixing chamber 37 is described using the example of a backlight for an LCD, other applications are possible and within the scope of the invention. For example, in some embodiments other surfaces besides the top of mixing chamber 37 may have openings in high reflectance material 34, for example the bottom surface of mixing chamber 37, such that light is extracted from more than one surface of mixing chamber 37. In addition, mixing chamber 37 need not be a shallow, rectangular shape.

In another embodiment of the present invention, the brightness profile emitted by a light source such as the sources illustrated in FIGS. 5 and 6 may be altered by a diverting optic placed over the source. Such sources may be used as a backlight for an LCD. For example, diverted sources may be used in the device illustrated in FIG. 3 without the high reflectance material 34 disposed on the top of hollow mixing chamber 37.

Figure 7:
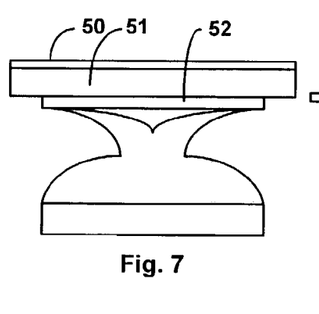
FIGS. 7, 8, and 9 illustrate embodiments of diverted light sources.
Figure 8:
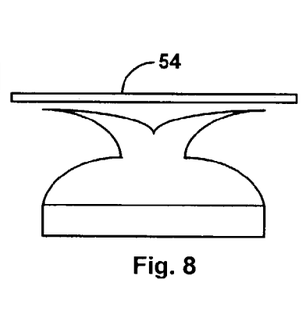
Figure 9:
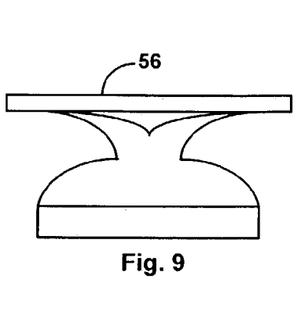

FIGS. 7, 8, and 9 illustrate three examples of diverter optics. In FIG. 7, a reflective material 52 is placed adjacent to LED 36. The reflective material 52 may at least 95% reflective, such as MIRO 2, available from Alanod as described above. The reflective material may be glued to the LED, or attached to the LED by a transparent material 51, for example PMMA or any other transparent mechanically stable material, provided over the reflective materal 52. Transparent material 51 serves as partly reflecting diverter. An optional diffuser material 50 may be provided over transparent material 51. Diffuser 50 may be a film diffuser, which diffuses on one surface, or a bulk diffuser, which diffuses through the bulk of the diffuser. Reflective material 52 creates a shadow on diffuser 50. The shadow may be at least partially eliminated by diffuser 50. In FIG. 8, specular or diffuse reflector foil 54, such as E60L available from Toray Industries is provided over LED 36. In FIG. 9, a bulk or film diffuser 56, such as Clarex DR75C available from Astra Products, Inc. P.O. Box 479 Baldwin, N.Y. 11510 is provided over LED 36.

The reflector materials, transparent materials, and diffuser materials described above may be disks or strips of material. In some embodiments, the LEDs are aligned in a row and the diverter optic is a strip of material disposed over the row of LEDs, for example by attaching the diverter optic to a diffuser or by attaching the diverter optic directly to the row of LEDs. Other LED arrangements besides rows are possible. In some embodiments, individual diverter optics are disposed over or attached to individual LEDs. For example, disks of diverter optic material may be attached to individual LEDs. Other shapes besides disks and strips may be used to obtain the desired brightness profile.

FIGS. 10, 11A–11B, 12A–12C, and 13 illustrate the brightness profiles of the devices illustrated in FIGS. 6, 7, 8, and 9.

Figure 10:
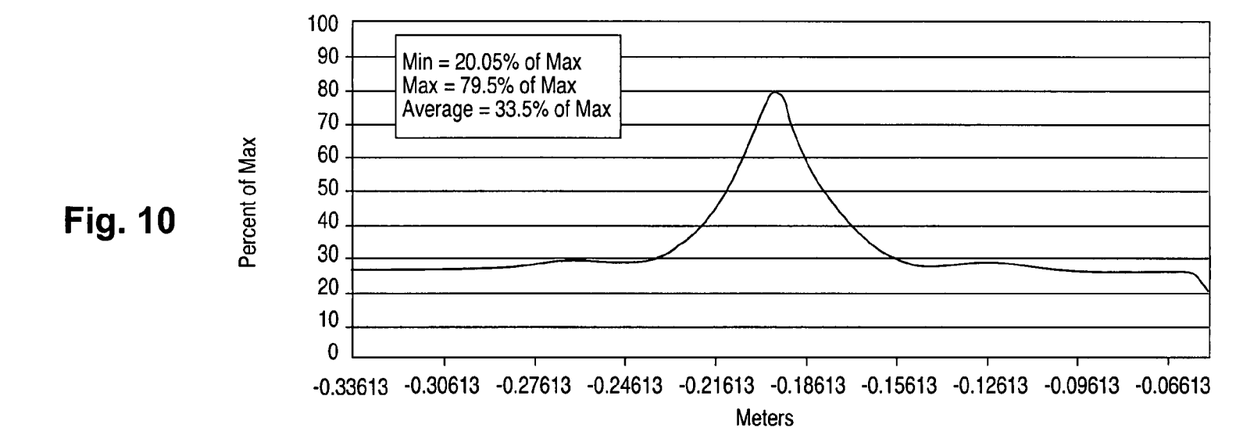
FIG. 10 illustrates the brightness profile exhibited by an undiverted light source.
Figure 11A:
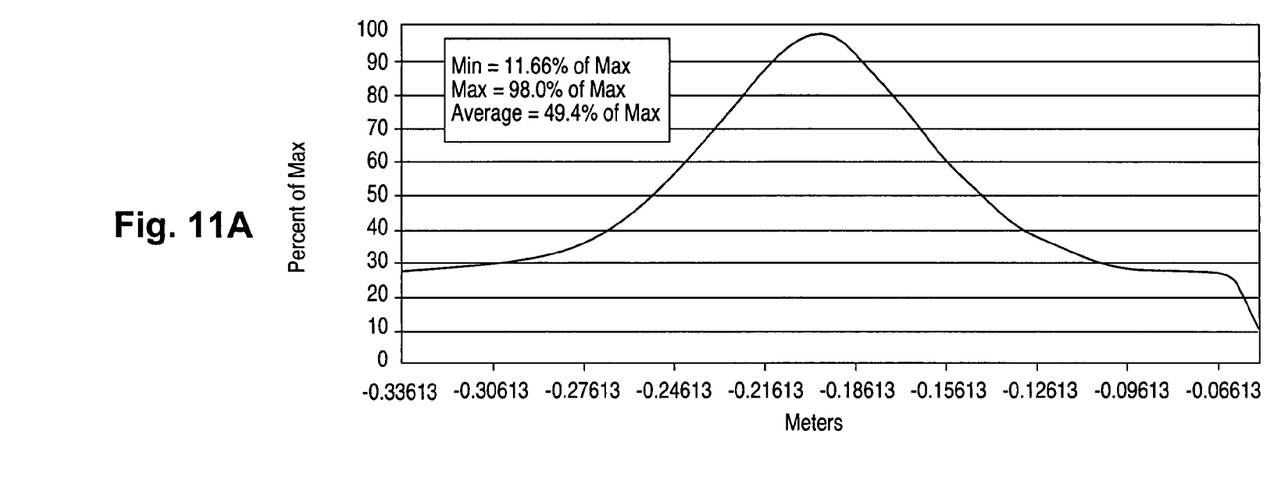
FIGS. 11A–11B, 12A–12C, and 13 illustrate the brightness profiles exhibited by the diverted light sources shown in FIGS. 7, 8, and 9.
Figure 11B:
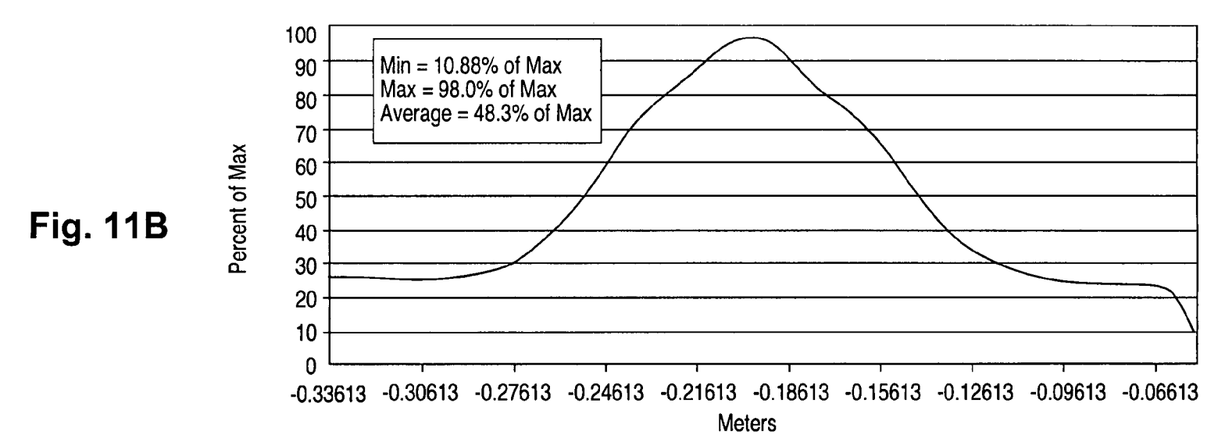

FIG. 10 illustrates the brightness profile of a lamp as illustrated in FIG. 5 without a diverter. FIG. 11A illustrates the brightness profile of the device illustrated in FIG. 7 with a 6 mm reflective disk 52, a strip of acrylic 51, and a strip of diffuser formed over the lamp. The presence of diverter 52, 51, and 50 widens the brightness profile considerably, spreading more of the light towards the edges of the box illustrated in FIG. 10. FIG. 11B illustrates the brightness profile of the device of FIG. 11A, except that the 6 mm reflective disk 52 is replaced with a 10 mm reflective disk. Increasing the diameter of the disk to 10 mm from 6 mm widens the peak shown in FIG. 11A.

Figure 12A:
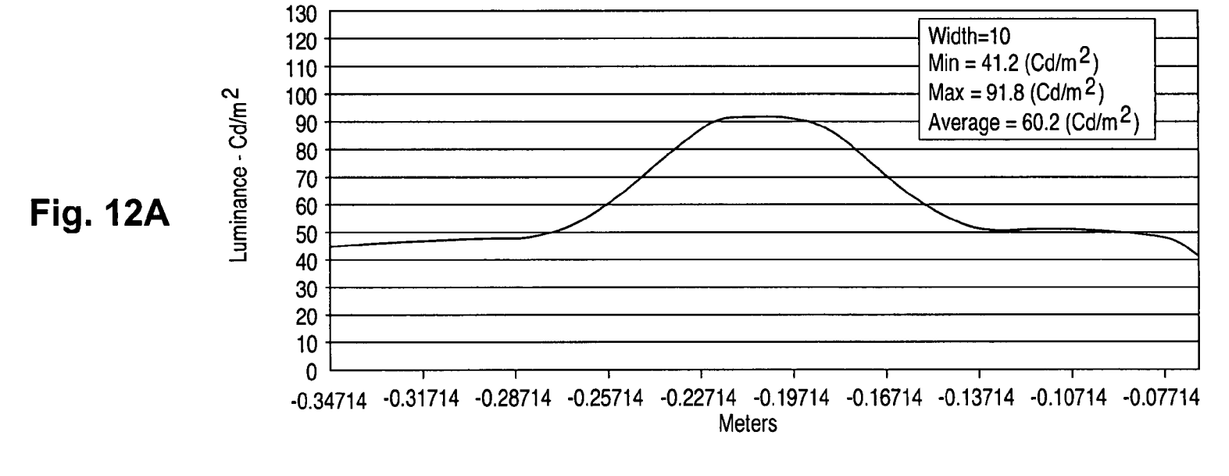
Figure 12B:
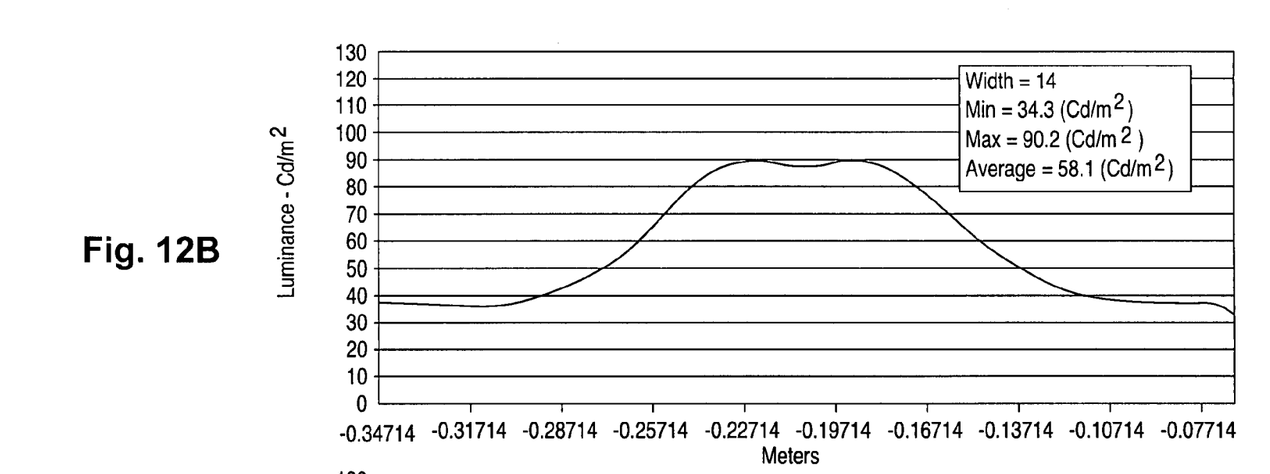
Figure 12C:
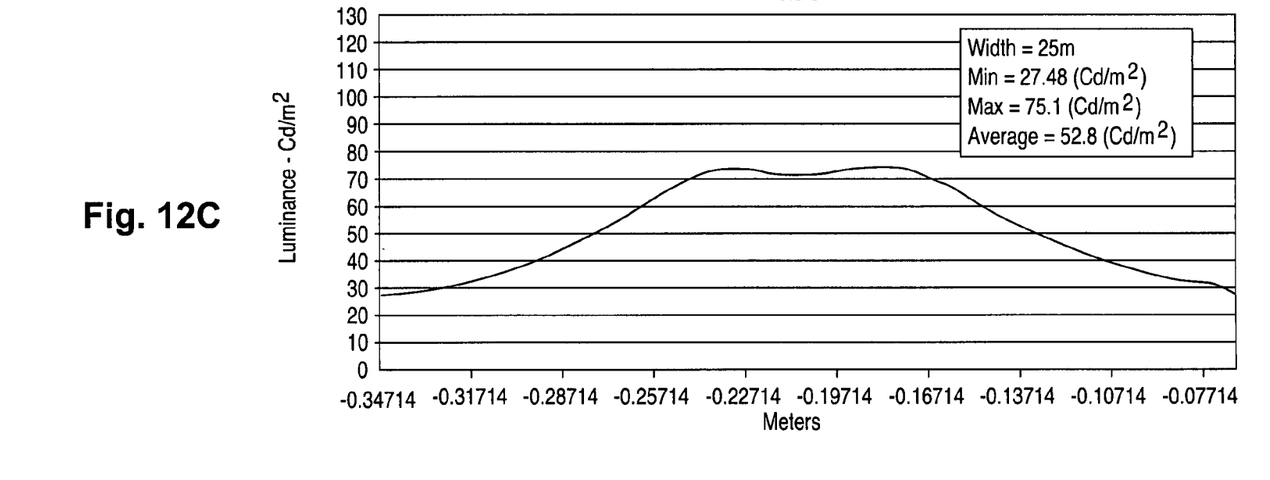

FIG. 12A illustrates the brightness profile of the device illustrated in FIG. 8 with a 10 mm wide strip of diffuse reflector foil. As is clear from a comparison of FIG. 12A and FIG. 11A, the device of FIG. 8 provides a much flatter brightness profile than the device of FIG. 7. When the 10 mm strip of foil is replaced by a 14 mm strip of foil, as illustrated in FIG. 12B, the peak in the brightness profile is reduced and further flattened, and becomes more broad. The device of FIG. 8 with a 25 mm strip of foil, as illustrated in FIG. 12C, has a further reduced, flattened, and broadened peak in the brightness profile.

Figure 13:
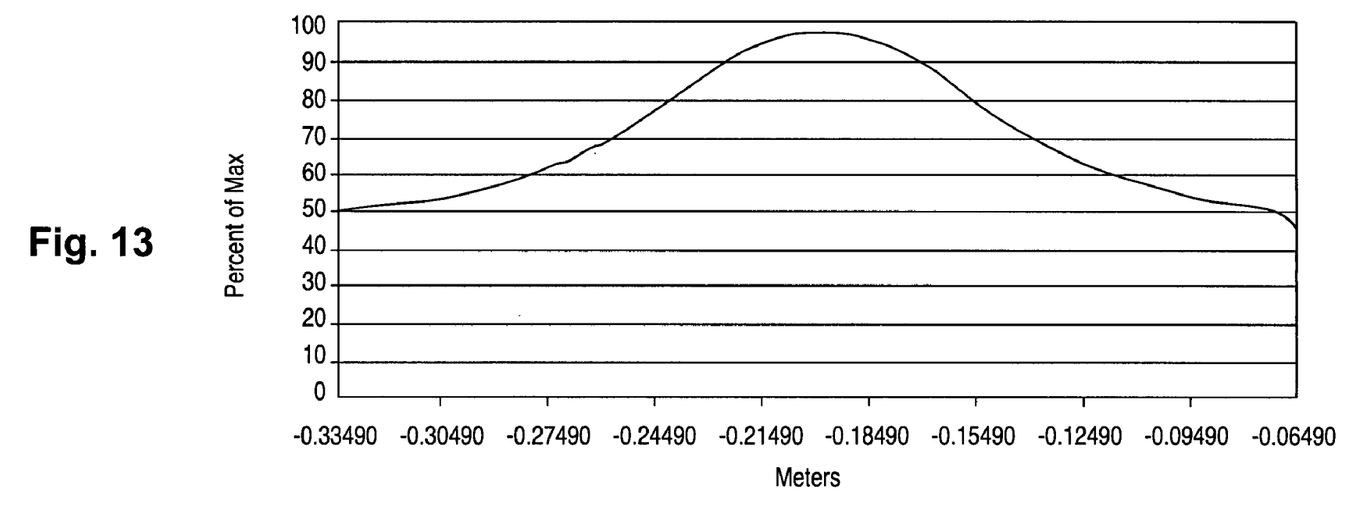

FIG. 13 illustrates the brightness profile of the device illustrated in FIG. 9 with a 10 mm wide bulk diffuser. As shown in FIGS. 10–13, the brightness profile of a side emitting LED can be adjusted by proper selection of a diverting optic, without modifying the device in which the light source is placed.

The use of diverting optics offers several advantages. Since light sources with diverter optics can be used in a hollow mixing chamber, heavy and bulky plastic light guides are eliminated. Diverting optics provide efficient mixing of light; thus devices with diverting optics can provide the uniform color and brightness in a thin display. Since the diverting optics provides efficient mixing, red, green, and blue sources can be used as a direct view backlight.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A structure comprising:
   a mixing chamber, the mixing chamber comprising:
      a first surface, wherein at least a portion of the first surface is reflective; and
      a second surface opposite the first surface, the second surface comprising:
         a reflective region; and
         a plurality of openings in the reflective region;
   a plurality of light emitting diodes disposed along the first surface; and
   a lens disposed over at least one of the plurality of light emitting diodes, the lens comprising:
      a bottom surface;
      a reflecting surface; and
      a refracting surface obliquely angled with respect to a central axis of the lens,
   wherein light entering the lens through the bottom surface and directly incident on the reflecting surface is reflected from the reflecting surface to the refracting surface and refracted by the refracting surface to exit the lens in a substantially perpendicular to the central axis of the lens.

2. The structure of claim 1 further comprising one or more side surfaces separating the first surface from the second surface.

3. The structure of claim 2 wherein at least a portion of at least one of the one or more side surfaces is reflective.

4. The structure of claim 1 wherein the reflective portion of the first surface is at least 90% reflective of light emitted by the plurality of light emitting diodes.

5. The structure of claim 1 wherein the reflective portion of the first surface is at least 98% reflective of light emitted by the plurality of light emitting diodes.

6. The structure of claim 1 wherein the reflective region of the second surface is at least 90% reflective of light emitted by the plurality of light emitting diodes.

7. The structure of claim 1 wherein the reflective region of the second surface is at least 98% reflective of light emitted by the plurality of light emitting diodes.

8. The structure of claim 1 wherein:
the plurality of light emitting diodes are disposed in a row; and
the openings comprise slits parallel to the row of light emitting diodes.

9. The structure of claim 8 wherein an area of the second surface directly over the plurality of light emitting diodes is part of the reflective region.

10. The structure of claim 1 wherein the mixing chamber is filled with air.

11. The structure of claim 1 further comprising a plurality of openings formed in the reflective portion of the first surface.

12. The structure of claim 1 wherein the plurality of light emitting diodes includes at least four light emitting diodes each emitting light at a different wavelength.

13. The structure of claim 1 wherein the plurality of light emitting diodes includes at least one phosphor-converted light emitting diode.

14. The structure of claim 1 wherein the second surface comprises a transparent material, and the reflective region comprises a reflective material formed on the transparent material.

15. The structure of claim 1 wherein the second surface comprises a diffuser, and the reflective region comprises a reflective material formed on the diffuser.

16. A structure comprising:
a mixing chamber, the mixing chamber comprising:
a first surface, wherein at least a portion of the first surface is reflective; and
a second surface opposite the first surface, the second surface comprising
a reflective region; and
a plurality of openings in the reflective region;
a plurality of light emitting diodes disposed along the first surface;
a first diffuser overlying the second surface;
a second mixing chamber overlying the first diffuser; and
a second diffuser overlying the second mixing chamber.

17. The structure of claim 16 further comprising a liquid crystal layer overlying the first diffuser.

18. The structure of claim 16 wherein the plurality of light emitting diodes include red, blue, and green light emitting diodes.

* * * * *

UNITED STATES PATENT AND TRADEMARK OFFICE
CERTIFICATE OF CORRECTION

PATENT NO. : 6,974,229 B2
DATED : December 13, 2005
INVENTOR(S) : Robert S. West et al.

It is certified that error appears in the above-identified patent and that said Letters Patent is hereby corrected as shown below:

<u>Column 8,</u>
Line 53, cancel "lens," and substitute -- lens; --.
Line 58, between "a substantially" insert -- a direction substantially --.

<u>Column 10,</u>
Line 13, cancel "comprising" and substitute -- comprising: --.

Signed and Sealed this

Twenty-first Day of March, 2006

JON W. DUDAS
*Director of the United States Patent and Trademark Office*